United States Patent [19]

Miller

[11] Patent Number: 5,135,884
[45] Date of Patent: Aug. 4, 1992

[54] METHOD OF PRODUCING ISOPLANAR ISOLATED ACTIVE REGIONS

[75] Inventor: Robert O. Miller, The Colony, Tex.

[73] Assignee: SGS-Thomson Microelectronics, Inc., Carrollton, Tex.

[21] Appl. No.: 677,649

[22] Filed: Mar. 28, 1991

[51] Int. Cl.[5] .......................................... H01L 21/265
[52] U.S. Cl. ........................................ 437/71; 437/89; 437/90; 437/228
[58] Field of Search ...................... 437/71, 89, 90, 228

[56] References Cited

U.S. PATENT DOCUMENTS

| | | | |
|---|---|---|---|
| 4,400,411 | 8/1983 | Yuan et al. | 437/228 |
| 4,628,591 | 12/1986 | Zorinsky et al. | 29/576 W |
| 4,810,667 | 3/1989 | Zorinsky et al. | 437/62 |

FOREIGN PATENT DOCUMENTS

| | | | |
|---|---|---|---|
| 53-144690 | 12/1978 | Japan | 437/69 |
| 55-134946 | 10/1980 | Japan | 437/71 |
| 58-23431 | 2/1983 | Japan | 437/89 |
| 59-134819 | 8/1984 | Japan | 437/90 |
| 61-170018 | 7/1986 | Japan | 437/90 |
| 61-203632 | 9/1986 | Japan | 437/89 |
| 8701239 | 2/1987 | World Int. Prop. O. | 437/89 |

OTHER PUBLICATIONS

Ghandhi, S., "VLSI Fabrication Principles . . . ", pp. 401-407, 1983.
IEDM, 1983, titled "Device Isolation Technology by Selective Low-Pressure Silicon Epitaxy," pp. 35-38, by H. J. Voss et al.
IEDM, 1983, titled "CMOS Technology Using SEG Isolation Technique," pp. 31-34, by N. Endo et al.
IEDM, 1984, titled "Application of Selective Silicon Epitaxial Growth for CMOS Technology," pp. 593-596, by S. Nagao, et al.
Proceedings of IEEE, vol. 70, No. 5, May 1982, pp. 420-426, titled "Silicon as a Mechanical Material" by Kurt E. Peterson.
S. M. Sze's Textbook, "Physics of Semiconductor Devices," pp. 7-13, 2nd ed. 1981, by John Wiley & Sons, Inc.
IEDM, 1982, titled "Novel Device Isolation Technology with Selective Epitaxial Growth," pp. 241-244, by Endo et al.

Primary Examiner—Olik Chaudhuri
Assistant Examiner—G. Fourson
Attorney, Agent, or Firm—Lisa K. Jorgenson; Richard K. Robinson

[57] ABSTRACT

A method is provided for forming isoplanar isolated regions in an integrated circuit, and an integrated circuit formed according to the same. According to a first disclosed embodiment, a first epitaxial layer is formed over a substrate, the substrate having a (100) crystal orientation. A first masking layer is formed over the first epitaxial layer. The first masking layer is patterned and the first epitaxial layer is etched to form openings. The sidewalls of these openings have a (111) crystal orientation. The first masking layer is then removed and a second masking layer is formed in the openings. The first epitaxial layer is anodized and oxidized. The second masking layer is removed and a second epitaxial layer is formed in the openings. According to an alternate embodiment, after the first epitaxial layer is anodized, the second epitaxial layer is formed in the openings and the first epitaxial layer is then oxidized. According to a further alternate embodiment, the first epitaxial layer is anodized and oxidized after the second epitaxial layer is formed in the openings.

30 Claims, 2 Drawing Sheets

METHOD OF PRODUCING ISOPLANAR ISOLATED ACTIVE REGIONS

FIELD OF THE INVENTION

The present invention relates generally to semiconductor integrated circuit processing, and more specifically to producing isoplanar isolated active regions.

BACKGROUND OF THE INVENTION

The trend to continue to miniaturize semiconductor integrated circuits to achieve submicron feature sizes and increase the number of devices fabricated on the integrated circuit has required faster downscaling of lateral dimensions than vertical dimensions, resulting in larger aspect ratios in surface topography. With densely packed circuits, there is a need to isolate components which are adjacent to each other to prevent leakage current. As with MOS transistors, current flows along the surface between the source and drain. The MOS transistors formed adjacent to each other must be separated by an isolation film thick enough so that there are no field induced currents flowing under the film. Isolating adjacent components in such a manner as to minimize surface topography is known as isoplanar isolation.

Before the introduction of local oxidation of silicon (LOCOS) processes, it was common to provide MOS field isolation by growing a thick layer of field oxide across the wafer, then masking and removing oxide where active areas were to be formed. Using a wet etch step, this process did not allow for the creation of vertical oxide sidewalls. However, potential step coverage problems were avoided with this process, but at the expense of layout space, thus limiting device performance.

The introduction of LOCOS was a great technological improvement. However, several problems occurred with LOCOS. Non-uniform thermal oxidation of a wafer surface, in the original LOCOS form, always incurred lateral encroachment, or tapering of the field oxide in the active areas growing under a nitride mask. This tapering effect, called "birdbeaking" is a sacrifice of active areas that becomes significant for feature sizes less than 1.5 microns. Attempts to suppress birdbeaking caused stress-related defects in the nearby substrate. Process complexity then occurred in attempting to avoid these stress-related defects.

To achieve submicron geometries, there can be little or no physical loss of the active areas as occurs with the birdbeaking phenomenon. Thus, it is necessary to reconsider the prior art approach where vertical walls are needed to manufacture devices with feature sizes less than 1.5 microns. Abrupt topography results from vertical walls, causing difficulty in subsequent patterning and etching of films deposited over the wafer. Moreover, vertical walls, or near vertical walls, can only be achieved by dry etching of oxide. Damage to the active areas may result from marginal overetching.

For a number of years, various observers have noticed the potential value of selective epitaxial refill of contact holes etched through field oxide in order to achieve a completely planar surface. Selective epitaxial refill may cause defects near the active area/field oxide interface because the epitaxial layer is unable to grow in the (111) direction. Anomalies in epitaxial growth may also result due to any etching damage of the starting surface before the epitaxial refill.

It would be desirable for a semiconductor process to produce isoplanar isolated active and field regions.

It is a further object of this invention to provide such a semiconductor fabrication process by anodizing and oxidizing the field oxide regions and refilling the remaining areas with epitaxial silicon.

It is yet another object of this invention to provide such a semiconductor fabrication process for making isoplanar active regions separated by isoplanar field oxide isolated regions which are suitable for use with small device geometries.

Other objects and advantages of this invention will be apparent to those of ordinary skill in the art having reference to the following specification, together with its drawings.

SUMMARY OF THE INVENTION

The invention may be incorporated into a method for forming an integrated circuit, and the integrated circuit formed thereby, by producing isoplanar isolated regions on the surface of a wafer having a (100) crystal orientation. A first epitaxial layer is formed over the substrate and then patterned and etched to form openings in the layer. This first epitaxial layer is anodized and oxidized. A second epitaxial layer is then formed in the openings. The second epitaxial layer may be formed after the first layer is anodized but before the first layer is oxidized. The second epitaxial layer may also be formed before the first layer is anodized and oxidized.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION OF THE PREFERRED EMBODIMENTS

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
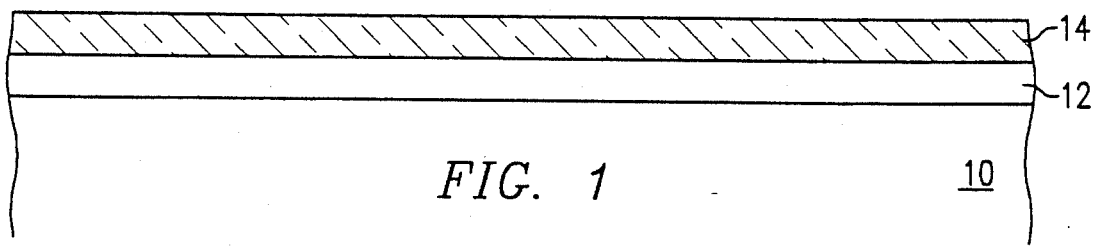
FIGS. 1–5 are cross-sectional views of the fabrication of an integrated circuit, at various steps, according to one embodiment of the invention.

Referring to FIG. 1, an integrated circuit is to be formed on a silicon substrate 10. The substrate must be a wafer which has a single crystal structure with the proper crystal orientation. The planes of the specific orientation are known in the art as the Miller indices, identified by a series of three numbers. The two most common crystal orientations for a silicon wafer are the (100) and (111) planes. In this invention, the substrate should preferably be from a wafer having the (100) orientation. The substrate may be doped with a p-type dopant as known in the art to act as an etch stop during subsequent anisotropic etch processes.

A first epitaxial layer of silicon 12 is then grown on the substrate 10 as known in the art. The epitaxial layer will conform to the same (100) crystal orientation as that of the underlying substrate. The epitaxial layer may be doped with an n-type dopant as known in the art to improve its etching properties. A first masking layer 14 is then deposited on the first epitaxial layer 12 as known in the art. The first masking layer is preferably silicon dioxide ($SiO_2$) or silicon nitride ($Si_3N_4$).

Figure 2:
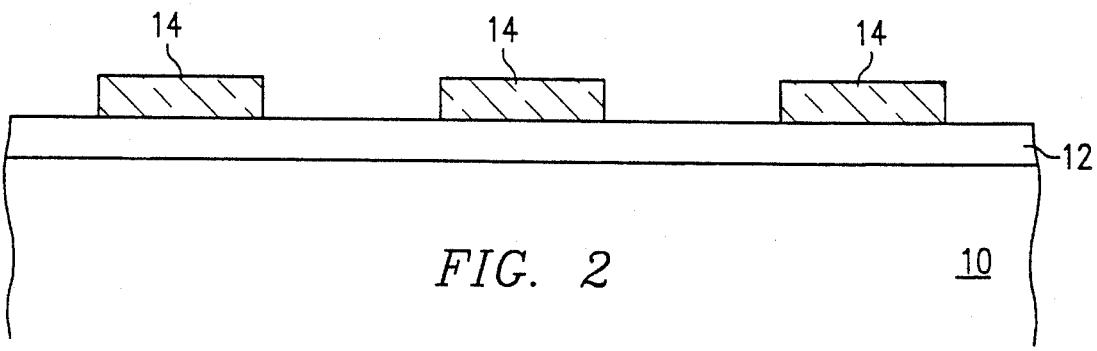
Figure 3:
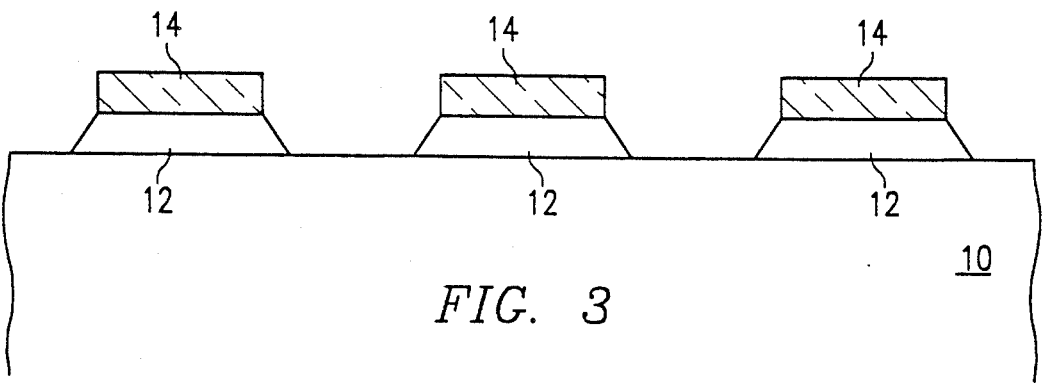

Referring to FIG. 2, the integrated circuit is then patterned to form openings in the first masking layer. The first epitaxial layer 12 is etched to form openings in the layer as shown in FIG. 3. The etch process is preferably an anisotropic etch which results in the sidewalls of the first epitaxial layer having a (111) crystal orientation or a nearly 54.74 degree slope. Among the alternative anisotropic etchants that may be used for this process depending upon the masking layer used may include ethylene diamine pyrocatechol ("EDP"), sodium hydroxide ("NaOH"), potassium hydroxide ("KOH") or hydrazine ("$N_2H_4$"). The first masking layer 14 is then removed by known methods.

An alternative etch process consists of a wet/dry etch combination as known in the art to produce the same (111) crystal orientation. Because the wet/dry etch process may result in defects in the crystal orientation of the sidewalls of the first epitaxial layer 12, passivation of the layer, such as a boron implant, may be required to eliminate such defects.

Figure 4:
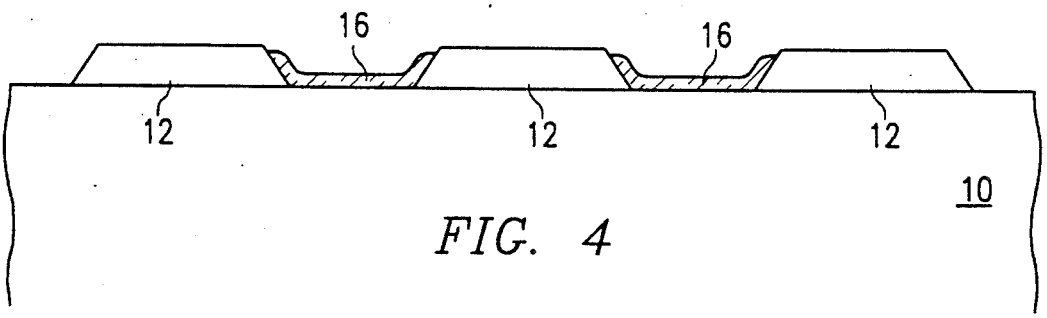

Referring to FIG. 4, a second masking layer 16 is deposited across the wafer surface and then patterned in the openings between the isolated first epitaxial layer 12 regions. The patterning of layer 16 involves a non-critical photolithographic alignment. This second masking layer 16 is preferably $Si_3N_4$. A thin layer of approximately 100-200 Angstroms of oxide may be grown or deposited under layer 16 before layer 16 is deposited to protect the underlying first epitaxial layer 12 and the substrate 10 during deposition and subsequent removal of layer 16. The first epitaxial layer 12 is then anodized converting the n-type doped layer to porous silicon. The n-type doped epitaxial layer will anodize faster than the p-type doped substrate. Layer 12 is subsequently oxidized to form isolated regions of oxide having sidewall angles of 54.73 degrees or the (111) crystal orientation.

Anodization of the isolated regions of layer 12 before oxidation allows layer 12 to retain its same volumetric size. The oxide expands to fill substantially the original space occupied by the anodized epitaxial silicon, thus creating little or no deformation of the integrated circuit. This anodization process of converting silicon to dioxide, known in the art, is described more fully in U.S. Pat. No. 4,628,591, application Ser. No. 666,698, issued Dec. 16, 1986, Method For Obtaining Full Oxide Isolation Of Epitaxial Islands In Silicon Utilizing Selective Oxidation Of Porous silicon, of E. J. Zorinsky and D. B. Spratt. The second masking layer 16, used a an anodization mask, is subsequently removed.

Figure 5:
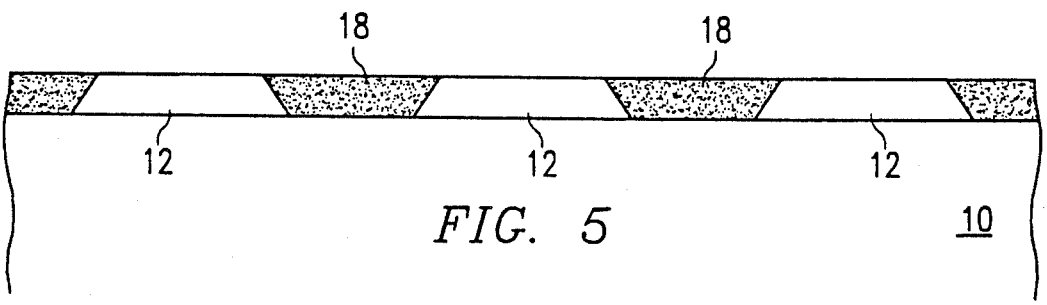

Referring to FIG. 5, a second layer of epitaxial silicon 18 is then grown in the active regions between the isolated regions of the first epitaxial layer 12. The regions Of epitaxial layer 18 are now suitable for fabrication of MOS devices isolated by the epitaxial regions 12.

An alternative embodiment includes growing and etching the first epitaxial layer 12 as above, again preferably having been doped with an n-type dopant. The second masking layer 16 is deposited. After layer 12 is anodized, the second masking layer 16 is removed. The second epitaxial layer 18 is then grown between the remaining isolated regions of the first epitaxial layer 12. Layer 12 is then oxidized to form insulating regions around layer 18 as shown in FIG. 5. A further alternative embodiment to the above process includes growing and etching the first epitaxial layer 12 as above. The second masking layer 16 is not deposited. The second epitaxial layer 18 is grown in between the isolated regions of layer 12. Layer 12 is subsequently anodized and oxidized to form the insulating regions around the epitaxial regions 18 as shown in FIG. 5. Because the isolated regions of layer 12 are doped with an n-type dopant, these regions will anodize at a faster rate than the second epitaxial layer 18 used to refill the active regions between the regions of layer 12.

Figure 6:
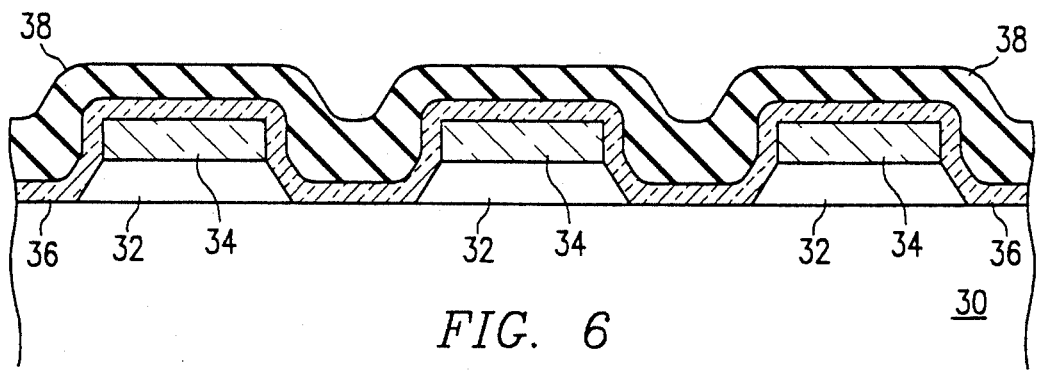
FIGS. 6–10 are cross-sectional views of the fabrication of an integrated circuit, at various steps, according to an alternative embodiment of the invention.

Referring to FIG. 6, an additional alternative method is shown. The process steps are the same as above to grow a first epitaxial layer 32 over a substrate 30, deposit and pattern a first masking layer 34 and etch layer 32. The crystal orientations are the same as those described above. Again, epitaxial layer 32 may be doped with an n-type dopant to improve its etching and anodizing properties.

Figure 7:
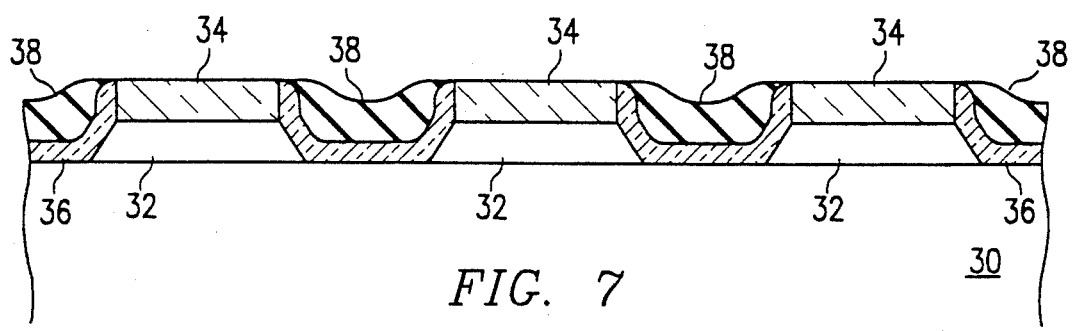
Figure 8:
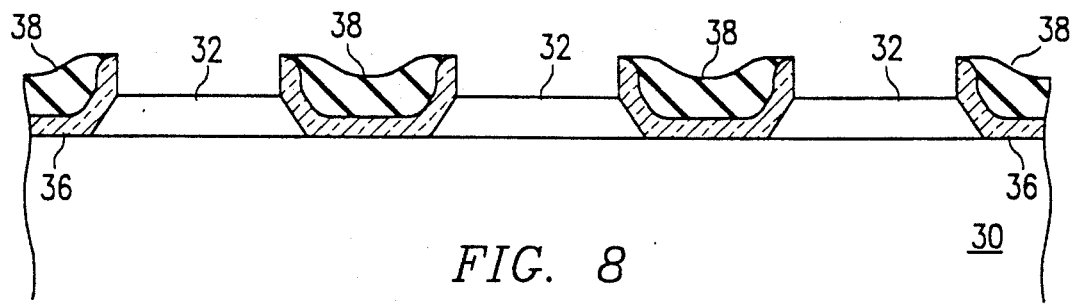

Next, a second masking layer 36 is conformally formed over the first masking layer 34. This second masking layer 36 is preferably silicon nitride or silicon nitride over a thin layer of oxide. The oxide may be grown or deposited while the silicon nitride is deposited by methods known in the art. If a thin layer of oxide is first formed under the silicon nitride, it generally will have a thickness between 100 and 200 Angstroms. A polymer layer 38 is then non-conformally spun onto the surface of the wafer. Layer 38 may be typically a polyimide or photoresist. Referring to FIG. 7, the second masking layer 36 and polymer layer 38 are then etched, preferably by a plasma etch. One of the advantages of this process is that the etch step, after layer 38 is spun onto the wafer, becomes self-aligning. Referring to FIG. 8, the first masking layer 34 is removed. The first epitaxial layer 32 is then anodized.

Figure 9:
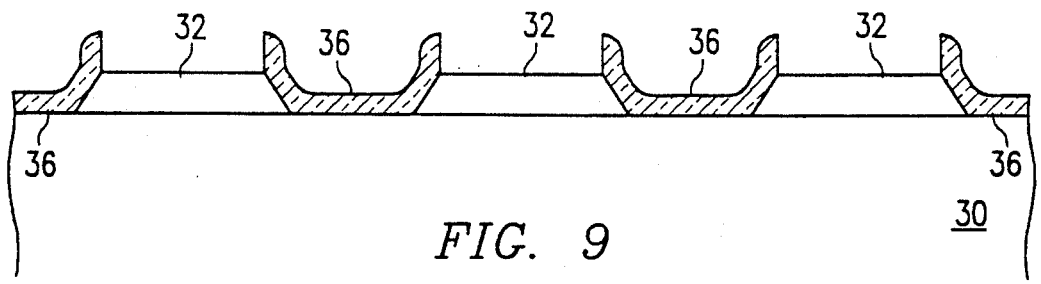
Figure 10:
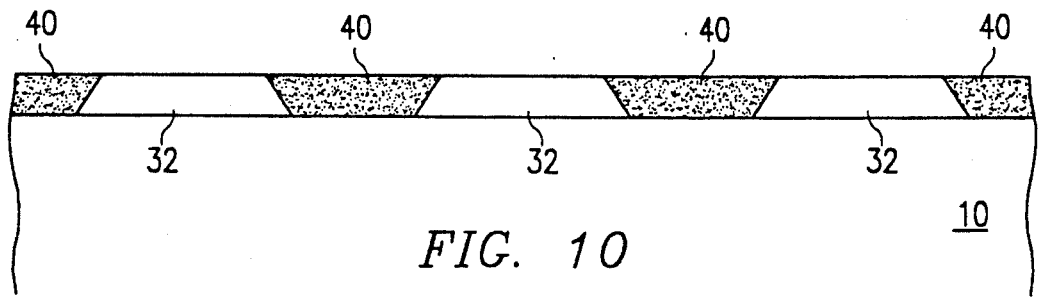

Referring to FIG. 9, the polymer layer 38 is preferably removed after anodization but before oxidation of layer 32. Layer 32 is then oxidized. The second masking layer 36 is removed. At this stage of the process, there are isolated regions of oxide formed from the first epitaxial layer 32. Referring to FIG. 10, a second epitaxial layer 40 is grown in the active regions between the isolated regions of oxide. These regions of layer 40 are now suitable for fabrication of MOS devices isolated by the epitaxial regions 32. This process may also be used for any device which needs to be isolated laterally by oxide. For example, thick epitaxial layers may make this process suitable for use in manufacturing high-voltage semiconductor devices.

Growth of the two epitaxial layers 12 and 18 as shown in FIG. 5 and layers 32 and 40 as shown in FIG. 10, forms a planar surface for subsequent processes. Anodizing and oxidizing epitaxial silicon forms isoplanar insulating regions of oxide around the active areas. The epitaxial silicon growth or epitaxial refill between the insulating regions of oxide provides for isolated active regions for fabrication of devices without sacrificing device performance or usable layout space.

What is claimed is:

1. A method of producing isoplanar isolated regions in an integrated circuit comprising the steps of:
    forming a first epitaxial layer over a substrate;
    forming a first masking layer over the first epitaxial layer;
    patterning the first masking layer;
    etching the first epitaxial layer to create sidewalls having a (111) crystal orientation and to form openings exposing a portion of the underlying substrate;
    forming a second masking layer in the openings;
    anodically porifying the first epitaxial layer;
    oxidizing the porified first epitaxial layer;
    removing the second masking layer; and,
    forming a second epitaxial layer in the openings.

2. The method of claim 1, wherein a p-type dopant has been implanted into the substrate.

3. The method of claim 1, wherein the first epitaxial layer is doped with an n-type dopant.

4. The method of claim 1, wherein the first masking layer is removed after the first epitaxial layer is etched.

5. The method of claim 1, wherein the first masking layer is removed after the first epitaxial layer is anodized.

6. The method of claim 1, wherein the first masking layer is silicon dioxide.

7. The method of claim 1, wherein the first masking layer is silicon nitride.

8. The method of claim 1, wherein the second masking layer is silicon nitride.

9. The method of claim 1, wherein the crystal orientation of the substrate is the (100) plane.

10. The method of claim 1, wherein the etching step is an anisotropic etch.

11. The method of claim 10, wherein the anisotropic etchant is EDP.

12. The method of claim 1, wherein the etching step is a combination wet/dry etch.

13. The method of claim 12, further comprising the step of passivating the sidewalls.

14. The method of claim 13, wherein the passivating step is a boron implant.

15. A method of producing isoplanar isolated regions in an integrated circuit comprising the steps of:
    forming a first epitaxial layer over a substrate;
    patterning the first epitaxial layer to form isolated regions;
    forming a second epitaxial layer in between the isolated regions; and,
    oxidizing the first epitaxial layer.

16. The method of claim 15, wherein the first epitaxial layer is anodized before the second epitaxial layer is formed.

17. The method of claim 16, wherein a second masking layer of silicon nitride is deposited between the isolated regions before anodization of the first epitaxial layer and removed after anodization of the first epitaxial layer.

18. The method of claim 15, wherein the first epitaxial layer is anodized after the second epitaxial layer is formed.

19. The method of claim 15, wherein a first masking layer is formed over the first epitaxial layer before the first epitaxial layer is patterned.

20. The method of claim 19, wherein the first masking layer is removed after the firs epitaxial layer is patterned.

21. The method of claim 15, wherein the crystal orientation of the substrate is the (100) plane.

22. The method of claim 21, wherein the etching step is an anisotropic etch which produces sidewalls having the crystal orientation of the (111) plane.

23. A method of producing isoplanar isolated regions in an integrated circuit comprising the steps of:
    forming a first epitaxial layer over a substrate;
    patterning and etching the first epitaxial layer to form isolated regions having sidewalls which have a (111) crystal orientation;
    oxidizing the first epitaxial layer; and,
    forming a second epitaxial layer in between the isolated regions;
    wherein the first epitaxial layer is anodically porified before the oxidizing step.

24. A method of producing isoplanar isolated regions in an integrated circuit comprising the steps of:
    forming a first epitaxial layer over a substrate;
    forming a first masking layer over the first epitaxial layer;
    patterning the firs masking layer;
    etching the first epitaxial layer to create sidewalls having a (111) crystal orientation and to form openings exposing a portion of the substrate;
    forming a polymer layer over the surface of the wafer;
    etching the polymer layer to expose the first masking layer;
    removing the first masking layer;
    anodically porifying the first epitaxial layer;
    oxidizing the first epitaxial layer; and,
    forming a second epitaxial layer in the openings.

25. The method of claim 24, wherein the polymer layer is removed after anodically porifying the first epitaxial layer.

26. The method of claim 24, wherein a second masking layer is formed before the polymer layer is formed.

27. The method of claim 26, wherein the second masking layer is silicon nitride.

28. The method of claim 26, wherein the second masking layer is a layer of silicon nitride over a layer of oxide.

29. The method of claim 26, wherein the polymer layer is removed before anodically porifying the first epitaxial layer.

30. The method of claim 26, wherein the polymer layer is removed after anodically porifying the first epitaxial layer.

* * * * *